United States Patent
Honda et al.

(10) Patent No.: US 6,512,031 B1
(45) Date of Patent: Jan. 28, 2003

(54) EPOXY RESIN COMPOSITION, LAMINATE FILM USING THE SAME, AND SEMICONDUCTOR DEVICE

(75) Inventors: Tsuyoshi Honda, Gunma-ken (JP); Miyuki Wakao, Gunma-ken (JP); Toshio Shiobara, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/550,287

(22) Filed: Apr. 14, 2000

(30) Foreign Application Priority Data

Apr. 15, 1999 (JP) .......................... 11-108010

(51) Int. Cl.⁷ .................. C08K 5/49; C08K 3/00; C08L 63/00; H01L 29/12
(52) U.S. Cl. .................. 524/115; 523/211; 523/443; 523/446; 525/486; 428/620
(58) Field of Search ............ 524/115; 523/211, 523/443, 446; 525/486; 428/620

(56) References Cited

U.S. PATENT DOCUMENTS

| | | | |
|---|---|---|---|
| 4,868,059 A | * | 9/1989 | Walker .................. 525/482 |
| 4,959,425 A | * | 9/1990 | Walker .................. 525/482 |
| 5,066,735 A | * | 11/1991 | Walker .................. 525/482 |
| 5,244,939 A | * | 9/1993 | Yasuda et al. .......... 523/466 |
| 5,349,029 A | * | 9/1994 | Nam | |
| 6,210,811 B1 | * | 4/2001 | Honda et al. .......... 428/620 |
| 6,383,659 B1 | * | 5/2002 | Honda et al. .......... 428/620 |

FOREIGN PATENT DOCUMENTS

JP    A10335389    12/1998

OTHER PUBLICATIONS

JP 04337366A English Abstract Nov. 25, 1992.*
JP 04348180A English Abstract Dec. 3, 1992.*
Nitto Technical Report, vol. 36, No. 1, pp. 24–29 (1998) month unavialble.

* cited by examiner

*Primary Examiner*—Margaret Medley
(74) *Attorney, Agent, or Firm*—Birch, Stewart, Kolasch & Birch, LLP (57) ABSTRACT

An epoxy resin composition comprising an epoxy resin, a first curing agent for polymerizing the epoxy resin into a linear polymer, and a second curing agent for crosslinking the linear polymer into a three-dimensional polymer. The use of two curing agents corresponding to straight chain growth reaction and crosslinking reaction of the epoxy resin optimizes the reaction conditions to B-stage, giving a semi-cured film having a minimized variation. A laminate includes a layer of the epoxy resin composition and a protective layer. By sealing a semiconductor chip with the film, there is obtained a semiconductor package having improved heat resistance, improved moisture resistance, low stress property.

8 Claims, 1 Drawing Sheet

FIG.1

EPOXY RESIN COMPOSITION, LAMINATE FILM USING THE SAME, AND SEMICONDUCTOR DEVICE

This invention relates to an epoxy resin composition which cures under optimum reaction conditions to B-stage, giving a semi-cured product having a minimized variation, a laminate film using the semi-cured product and suited for semiconductor packaging, and a semiconductor device sealed with the film.

BACKGROUND OF THE INVENTION

The recent trend of electronic equipment is characterized by high speeds of size and weight reduction. Under the circumstances, it is desired to reduce the size and weight of semiconductor devices serving as the brain of electronic equipment. The ultimate target is to reduce the packaging area to the chip size, realizing a chip size package (CSP).

Epoxy resins are widely used in constructing semiconductor packages because of their good adhesion, heat resistance and moisture resistance. As the package system is diversified as mentioned above, epoxy resins are now used not only as the encapsulants well known in the art, but also as coating, die bonding and underfill materials. Most such materials are diluted with solvents or in paste form.

Of these, the solvent-diluted materials require an attention to carefully remove the solvent that volatilizes off on use, from the standpoints of the health maintenance and safety of workers, undesirably adding to the cost.

Coating materials are used in several ways. One proposed method is to cover the surface of a semiconductor chip solely with a thin film of an epoxy resin composition to effect sealing. It is also proposed to screen print an epoxy resin composition in paste form. These materials include paste-like epoxy resin compositions such as those of the acid anhydride curing type and the amine curing type which are well known in the art. Alternatively, these paste-like epoxy resin compositions may take the form of a film which has been converted to B-stage on a support.

Most of the prior art die bonding and underfill materials were paste-like epoxy resin compositions. Recently, films formed from paste-like die bonding materials are widely utilized. On use, a film is pressed against a lead frame or substrate, and a semiconductor chip is joined onto the film whereupon the film is cured. Most of these die bonding materials are epoxy resin compositions of the acid anhydride curing type and the amine curing type which are well known in the art.

These B-staged films are easier to handle than paste-like materials and provide a very promising system that contributes to the simplification of a semiconductor device fabricating process. However, the epoxy resin compositions of the acid anhydride curing type and the amine curing type are insufficient in the storage of uncured compositions and the moisture resistance and high-temperature performance of cured compositions. They are unsatisfactory in directly covering the semiconductor chip surface with a thin film. In regard to the reaction of converting to B-stage the epoxy resin compositions of the acid anhydride curing type or the amine curing type, it is difficult to optimize the reaction conditions to B-stage to produce a semi-cured product having a minimized variation because the straight chain growth reaction and the crosslinking reaction of the epoxy resin are identical.

Therefore, an object of the invention is to provide an epoxy resin composition which uses two curing agents separately for straight chain growth reaction and crosslinking reaction of an epoxy resin to optimize the reaction conditions to B-stage, giving a semi-cured film having a minimized variation.

Another object of the invention is to provide a laminate film comprising a flexible, easy-to-work thin layer of the epoxy resin composition in a semi-cured state.

A further object of the invention is to provide a semiconductor device in which the gap between a semiconductor chip and a substrate or the surface of a semiconductor chip is sealed with the epoxy resin composition in film form.

SUMMARY OF THE INVENTION

We have found that by using two distinct curing agents corresponding to straight chain growth reaction and crosslinking reaction (reaction to form a three-dimensional structure) of an epoxy resin, the reaction conditions under which the epoxy resin composition is converted into B-stage are optimized so that a semi-cured product may be obtained at a minimized variation. This is especially true when a difunctional epoxy resin is used as the epoxy resin and a difunctional phenolic resin is used as the curing agent for straight chain growth reaction. Further, when an imidazole compound is used as the curing agent for crosslinking reaction, and when an organic phosphorus compound is further blended as a curing accelerator for the B-staging reaction between components (A) and (B) to extend the chain length, the storage stability of a semi-cured product and the moisture resistance of a cured product are improved over prior art epoxy resin compositions of the acid anhydride curing type or the amine curing type. The semi-cured or B-staged product of the epoxy resin composition gives a film which is flexible and easy to handle. When the surface of a semiconductor chip or the gap between a semiconductor chip and a substrate is coated or sealed with this film, there is obtained a semiconductor package having improved reliability.

In a first aspect, the invention provides an epoxy resin composition comprising (A) an epoxy resin, (B) a first during agent for polymerizing the epoxy resin (A) into a linear polymer, and (C) a second curing agent for crosslinking the linear polymer of components (A) and (B) into a three-dimensional polymer. An epoxy resin composition comprising a linear polymer obtained by previously reacting components (A) and (B) before the start of component (C) to form a three-dimensional crosslinked structure, and component (C) is also provided as a semi-cured or B-staged product. In one preferred embodiment, component (A) is a difunctional epoxy resin, component (B) is a difunctional phenolic resin, component (C) is an imidazole compound. Further preferably, an organic phosphorus compound is blended as a curing accelerator for components (A) and (B).

In a second aspect, the invention provides a laminate film comprising at least two layers, at least one of which is formed of the epoxy resin composition in a semi-cured state to a thickness of 20 to 150 μm.

In a third aspect, the invention provides a semiconductor device in which a surface of a semiconductor chip or a gap between a semiconductor chip and a substrate is sealed with the laminate film.

BRIEF DESCRIPTION OF THE DRAWING

The only FIGURE.

DESCRIPTION OF THE PREFERRED EMBODIMENTS

Epoxy resin The epoxy resin which can be used in the epoxy resin composition of the invention is not critical with respect to its structure, molecular weight, etc. However, the use of a difunctional epoxy resin (i.e., an epoxy resin having two epoxy groups in a molecule) is preferred from the standpoint of facilitating B-staging reaction to form a flexible semi-cured product as will be described later. Illustrative examples of the difunctional epoxy resin include bisphenol type epoxy resins of the following general formula (2) and biphenyl type epoxy resins of the following general formula (3).

(2)

Herein, $R^1$ is hydrogen or bromine, $R^2$ is hydrogen or a monovalent hydrocarbon group of 1 to 10 carbon atoms, especially alkyl such as methyl or ethyl, and X is —$CH_2$—, —$C(CH_3)_2$—, —$C(CF_3)_2$—, —O—, —CO—, —S—, or —$SO_2$—.

(3)

Herein, $R^1$ is hydrogen or bromine, and $R^2$ is hydrogen or a monovalent hydrocarbon group of 1 to 10 carbon atoms, especially alkyl such as methyl or ethyl.

These epoxy resins may be used alone or in admixture of two or more. In combination with the above-described epoxy resins, any conventional well-known epoxy resin may be used. The conventional epoxy resins include novolac epoxy resins such as phenol novolac type epoxy resins, cresol novolac type epoxy resins, and phenyl-cresol co-condensed novolac type epoxy resins; trishydroxyphenylalkane type epoxy resins such as trishydroxyphenylmethane type epoxy resins and trishydroxyphenylpropane type epoxy resins, naphthalene type epoxy resins, cyclopentadiene type epoxy resins, and phenol aralkyl type epoxy resins. Such conventional epoxy resins are blended in such amounts as not to hamper the flexibility and handling of a semi-cured film of the epoxy resin composition.

These epoxy resins preferably have a total chlorine content of not more than 1,500 ppm, and especially not more than 1,000 ppm. When chlorine is extracted from the epoxy resin with water at an epoxy resin concentration of 50% and a temperature of 120° C. over a period of 50 hours, the water-extracted chlorine content is preferably not more than 5 ppm. At a total chlorine content greater than 1,500 ppm or a water-extracted chlorine level of more than 5 ppm, the encapsulated semiconductor would become less resistant to moisture.

Curing agent

Two distinct curing agents are used in the epoxy resin composition of the invention. They are (B) a first curing agent for polymerizing the epoxy resin into a linear polymer and (C) a second curing agent for crosslinking the linear polymer of the epoxy resin and the first curing agent into a three-dimensional polymer.

The first curing agent (B) is not critical with respect to its structure, molecular weight, etc. However, the use of a difunctional phenolic resin (i.e., a phenolic resin having two phenolic hydroxy groups in a molecule) is desired from the standpoint of facilitating B-staging reaction to form a flexible semi-cured product as will be described later or improving the storage stability of a semi-cured product and the moisture resistance of a cured product. Illustrative examples of the difunctional phenolic resin include bisphenol resins of the following general formula (4) and biphenyl type phenolic resins of the following general formula (5).

Herein, $R^1$, $R^2$ and X are as defined above.

These phenolic resins may be used alone or in admixture of two or more. In combination with the above-described phenolic resins, any conventional well-known phenolic resin may be used. The conventional phenolic resins include novolac resins such as phenolic novolac resins, cresol novolac resins, and phenol-cresol co-condensed novolac resins; trishydroxyphenylalkane type phenolic resins such as trishydroxyphenylmethane type phenolic resins and trishydroxyphenylpropane type phenolic resins, naphthalene type phenolic resins, cyclopentadiene type phenolic resins, and phenol aralkyl resins. Such conventional phenolic resins are blended in such amounts as not to hamper the flexibility and handling of a semi-cured film of the epoxy resin composition.

With respect to the blend ratio of the epoxy resin and the first curing agent which are typically the difunctional epoxy resin and the difunctional phenolic resin, respectively, they are preferably blended in such amounts as to meet $1/1 < a \leq 10/1$, and more preferably $2/1 < a \leq 5/1$ wherein "a" is the equivalent ratio (or molar ratio) of epoxy groups to phenolic hydroxyl groups. If $a \leq 1/1$, many epoxy groups can be consumed in the growth of a linear polymer under some B-staging reaction conditions, so that only an insufficient crosslink density may be achieved through reaction with the second curing agent (C) and a cured product may have less heat resistance. If $a > 10/1$, the B-staging reaction does not fully proceed so that a semi-cured product may become difficult to handle.

The second curing agent (C) is not critical with respect to its structure, molecular weight, etc. However, the use of an imidazole compound is desired from the standpoint of facilitating B-staging reaction to form a flexible semi-cured product as will be described later or improving the storage stability of a semi-cured product and the moisture resistance of a cured product. Illustrative examples of the imidazole compound include 2-methylimidazole, 2-ethylimidazole, 2-ethyl-4-methylimidazole, 2-phenylimidazole, 2-phenyl-4-methylimidazole, 2-phenyl-4-methyl-5-hydroxymethylimidazole, and 2-phenyl-4,5-dihydroxymethylimidazole. One or more of these imidazole compounds may be used.

Desirably, the imidazole compound is blended in such amounts as to meet $0.001 \leq b \leq 0.2$, and more desirably $0.01 \leq b \leq 0.01$, wherein "b" is [the weight of imidazole compound]/[(the weight of epoxy resin)×(a−1)/a]. If b<0.001, only an insufficient crosslink density may be achieved and a cured product may have less heat resistance. If b>0.2, the storage stability of a semi-cured product and the moisture resistance of a cured product may be exacerbated.

In the epoxy resin composition of the invention, an organic phosphorus compound may be used as a curing accelerator for components (A) and (B), especially difunctional epoxy resin and difunctional phenolic resin. Illustrative examples of the organic phosphorus compound include triorganophosphines and quaternary phosphonium salts such as triphenylsphosphine, tributylphosphine, tri(p-toluyl)phosphine, tri(p-methoxyphenyl)phosphine, tri(p-ethoxyphenyl)phosphine, triphenylphosphine triphenyl borate, and tetraphenyl phosphonium tetraphenyl borate. One or more of these compounds may be used.

Desirably, the organic phosphorus compound is blended in such amounts as to meet $0.0001 \leq c \leq 0.1$, and more desirably $0.001 \leq c \leq 0.05$, wherein "c" is [the weight of organic phosphorus compound]/[(the weight of epoxy resin)×(1/a)+(the weight of phenolic resin)]. If c≦0.0001, the B-staging reaction does not fully proceed so that a semi-cured product may become difficult to handle. If c>0.1, the moisture resistance of a cured product may be exacerbated.

The epoxy resin composition of the invention is desirably utilized in the form of a semi-cured or B-staged product which is obtained by reacting the epoxy resin with only the first curing agent (B) to form a linear polymer and interrupting the reaction prior to the start for the second curing agent (C) to form a crosslink structure. Typically the straight chain growth reaction and crosslinking reaction of the epoxy resin are thermally induced reactions. Therefore, to facilitate formation of a semi-cured product with a minimal variation by optimizing the reaction conditions to B-stage, it is necessary that (the termination temperature of straight chain growth reaction)<(the starting temperature of crosslinking reaction), and at the B-staging temperature, (the termination time of straight chain growth reaction)<(the starting time of crosslinking reaction). To fulfill this requirement, it is desirable to use a difunctional epoxy resin as the epoxy resin (A), a difunctional phenolic resin as the first curing agent (B), an imidazole compound as the second curing agent (C), and an organic phosphorus compound as the curing accelerator for the difunctional epoxy and phenolic resins.

The B-staging reaction conditions are (the termination temperature of straight chain growth reaction)<(B-staging temperature)<(the starting temperature of crosslinking reaction), and at the B-staging temperature, (the termination time of straight chain growth reaction)<(B-staging time)<(the starting time of crosslinking reaction). As long as these requirements are met, the B-staging reaction grows only a linear structure, but does not form a crosslink structure, resulting in a semi-cured film which is flexible, easy to handle and stable during storage.

Filler

Depending on a particular application, an inorganic filler may be used in the epoxy resin composition of the invention. Exemplary fillers include natural silicas such as crystalline silica and amorphous silica, fused silica, synthetic high-purity silica, synthetic spherical silica, talc, mica, silicon nitride, boron nitride, alumina, and conductive particles such as silver powder, alone or in admixture of two or more. The shape of the inorganic filler is not critical, and spherical, ground and irregular shapes may be used, with the spherical one being preferred. An appropriate amount of the inorganic filler blended is about 100 to 1,000 parts, more preferably about 150 to 400 parts by weight per 100 parts by weight of the entire resin content (that is, the epoxy resin content plus the content of a phenolic resin as the first curing agent and an aromatic polymer-organopolysiloxane copolymer to be described later, if blended).

The particle size of the inorganic filler is limited by the thickness of a laminate film. Desirably, the maximum particle size of the inorganic filler is less than the laminate film thickness, and the mean particle size is less than ½ of the laminate film thickness. Usually, the inorganic filler having a maximum particle size of less than 150 μm, preferably less than 75 μm, and a mean particle size of about 0.1 to 70 μm, more preferably about 1 to 30 μm is used. It is noted that the mean particle diameter can be determined as the weight average value (or median diameter) based on the laser light diffraction technique, for example.

Copolymer

In one preferred embodiment, a copolymer obtained by reacting an aromatic polymer with a specific organopolysiloxane is blended in the epoxy resin composition in order to improve the low stress property thereof.

The aromatic polymers used herein include a variety of compounds, for example, epoxy resins and phenolic resins of the following structural formulae (6) and (7).

(6)

(7)

Other useful aromatic polymers are alkenyl group-bearing compounds (epoxy resins or phenolic resins) having the following structural formulae (8) to (10).

(8)

(9)

(10)

Herein, R⁴ is hydrogen or methyl, R⁵ is hydrogen or bromine, R⁶ is hydrogen or glycidyl:

letter n is 0 or a natural number, preferably an integer of 0 to 50, more preferably an integer of 1 to 20, m is 0 or a natural number, preferably an integer of 0 to 50, more preferably 0 or 1; p and q are natural numbers, preferably the sum of p+q is from 2 to 50, more preferably from 2 to 20.

The organopolysiloxane is of the following compositional formula (1).

$$R_a R'_b SiO_{(4-a-b)/2} \quad (1)$$

Herein R represents hydrogen, an amino, epoxy, hydroxyl or carboxyl-bearing monovalent hydrocarbon group or an alkoxy group. R' represents a substituted or unsubstituted monovalent hydrocarbon group. The letters a and b are positive numbers satisfying $0.001 \leq a \leq 1$, $1 \leq b \leq 2$, and $1 \leq a+b \leq 3$. The number of silicon atoms in one molecule is from 2 to 1,000, and the number of functional groups R directly attached to silicon atoms in one molecule is at least 1, preferably 1 to 5, more preferably 1 to 3, especially 2. Differently stated, R is a functional group capable of reacting with epoxy, phenolic hydroxyl or alkenyl groups in the aromatic polymer to form a copolymer.

Of the groups represented by R, the amino-bearing monovalent hydrocarbon groups are exemplified by wherein n is an integer of 1 to 3; the epoxy-bearing monovalent hydrocarbon groups are exemplified by wherein n is an integer of 1 to 3; the hydroxy-bearing monovalent hydrocarbon groups are exemplified by wherein m is an integer of 0 to 3 and n is an integer of 1 to 3; the carboxyl-bearing monovalent hydrocarbon groups are exemplified by —$C_xH_{2x}$COOH wherein x is an integer of 0 to 10; and the alkoxy groups are exemplified by those of 1 to 4 carbon atoms such as methoxy, ethoxy, and n-propoxy.

The substituted or unsubstituted monovalent hydrocarbon groups represented by R' are preferably those of 1 to 10 carbon atoms, for example, alkyl groups such as methyl, ethyl, n-propyl, isopropyl, n-butyl, isobutyl, tert-butyl, pentyl, neopentyl, hexyl, cyclohexyl, octyl and decyl; alkenyl groups such as vinyl, allyl, propenyl and butenyl; aryl groups such as phenyl and tolyl; aralkyl groups such as benzyl and phenylethyl; and halo-substituted monovalent hydrocarbon groups obtained by substituting halogen atoms for some or all of the hydrogen atoms on the foregoing hydrocarbon groups. Preferably, R' is a group which does not have an aliphatic unsaturated bond, typically alkyl group, aryl group, aralkyl group or halogen-substituted alkyl group. Among them, methyl group, phenyl group and 3,3,3-trifluoropropyl group are preferred.

Preferably, letters a and b satisfy $0.01 \leq a \leq 0.1$, $1.8 \leq b \leq 2$, and $1.85 \leq a+b \leq 2.1$, and the number of silicon atoms is from 10 to 400, more preferably from 20 to 210.

Illustrative examples of the organopolysiloxane are compounds of the following structures.

(11)

(12)

In formulae (11) and (12), R' represents a substituted or unsubstituted monovalent hydrocarbon group as in formula (1), preferably methyl or phenyl; X represents an amino, epoxy, hydroxyl or carboxyl-bearing monovalent hydrocarbon group; p is an integer of 0 to 1,000, preferably 8 to 400; and q is an integer of 0 to 20, preferably 0 to 5.

Specific examples are diorganopolysiloxane as given below.

Desirably the organopolysiloxane has a molecular weight of 100 to 70,000 though not critical. When a copolymer obtained from an organopolysiloxane having a molecular weight of 100 to 70,000 is blended in an epoxy resin composition, the copolymer is not compatible with the matrix and rather forms a fine island-in-sea structure. If the molecular weight is less than 100, the resulting copolymer would become compatible with the matrix so that the island-in-sea structure disappears. If the molecular weight is greater than 70,000, an enlarged island-in-sea structure would form. In either case, the cured composition would lose the desired low stress property.

Any well-known method may be used in reacting the aromatic polymer with the organopolysiloxane to form a copolymer.

An appropriate amount of the copolymer blended is 0 to about 100 parts, more preferably about 1 to 50 parts by weight per 100 parts by weight of the epoxy resin and first curing agent combined. Especially for the phenolic curing type epoxy resin compositions, the ratio of the total content of phenolic hydroxyl groups to the total content of epoxy groups in the entirety of the epoxy resin, phenolic resin and copolymer is desirably from 0.5 to 2.0, more desirably from 0.8 to 1.2. If the total phenolic hydroxyl group content relative to the total epoxy group content is outside this range, the resin composition would not fully cure and hence, lose heat resistance.

Various additives such as pigments (e.g., carbon black), dyes, flame retardants, coupling agents, and thermoplastic resins may be blended in the epoxy resin composition depending on its particular application.

In preparing the epoxy resin composition, the order of blending the components is not critical. Also, the mixing method is not critical. For example, the components are previously blended, then mixed in a suitable mixer, two or three-roll mill or kneader. If necessary, a solvent is used to assist in mixing although the solvent is removed during the B-staging step.

The epoxy resin composition of the invention or a semi-cured product thereof is effectively used in semiconductor packaging, preferably after the composition is formed into a film. More preferably, a laminate film comprising at least two layers is contemplated wherein the epoxy resin composition is used as at least one layer thereof. The film or layer made of the epoxy resin composition preferably has a thickness of 20 to 150 μm. The material and thickness of the remaining layers are selected in accordance with the particular application of the laminate film.

One specific example is a laminate film consisting of a layer of the epoxy resin composition and a protective sheet which is bonded to one surface or each surface of the layer for the purpose of protecting the layer, examples of the protective sheet being a silicone sheet, Teflon® sheet, or polyethylene terephthalate (PET) sheet having parting silicone or Teflon® coated on its surface. Another exemplary laminate film has a layer of adhesive between the layer of the epoxy resin composition and the protective sheet or sheets, the adhesive layer serving to providing a quick bond to a substrate or semiconductor chip at room temperature.

The laminate film is manufactured by any desired method. For example, the epoxy resin composition is worked into a film shape by drawing on a roll mill or coating onto a protective film, then heated at a predetermined temperature for a predetermined time (e.g., at about 50 to 100° C. for about 1 to 30 minutes) by means of a hot air blower or IR heater to effect conversion to B-stage. Where a solvent is used in the film forming process, it is desirable to heat stepwise from below the boiling point of the solvent to simultaneously effect B-staging reaction and solvent removal. Also, depending on a particular application of the laminate film, the film is cut into strips or sliced into tapes (which are wound). Depending on the application, the strip or tape is further cut to the desired shape, which is used after the protective sheet is removed.

The laminate film is applicable to any semiconductor device although it is advantageously applied to small, thin semiconductor devices such as CSP. The laminate film is effective in establishing a bond in the narrow gap between a chip and a substrate. As compared with conventional acid anhydride curing type or amine curing type compositions, the inventive composition is effective in forming a reliable bond. The manner of using the laminate film is not critical. One typical procedure involves cutting the laminate film to a suitable size, moderately pressing the film to a substrate, mounting a chip on the film, and applying heat and pressure to the assembly, for example, effecting thermocompression at about 150 to 200° C. and about 1 to 30 kgf/cm$^2$ for about 1 to 20 seconds whereby the semi-cured product in the form of B-staged film is crosslinked into a cured product, thereby completing a semiconductor device. The film may be preheated before the mounting of the chip.

The epoxy resin composition of the invention uses two distinct curing agents for straight chain growth reaction and crosslinking reaction of the epoxy resin to optimize the B-staging reaction conditions, giving a semi-cured product, especially in film form, having a minimized variation. Using a semi-cured product of the epoxy resin composition, there is obtained a laminate film of at least two layers including at least one layer in the form of a flexible, easy-to-handle thin film. By encapsulating or sealing a surface of a semiconductor chip or the gap between a semiconductor chip and a substrate with the film-shaped epoxy resin composition, there is obtained a semiconductor package having improved heat resistance, improved moisture resistance, low stress property.

EXAMPLE

Examples of the invention are given below by way of illustration and not by way of limitation. Tg is a glass transition temperature.

Examples 1–5 & Comparative Examples 1–2

Difunctional epoxy resins A to E or trifunctional epoxy resin F shown in Table 1 and represented by the structural formulae (13) to (17) below, difunctional phenolic resins A to E or trifunctional phenolic resin F shown in Table 2 and represented by the structural formulae (18) to (22) below, an imidazole compound (2-phenyl-4,5-dihydroxymethylimidazole, 2PHZ), an organic phosphorus compound (triphenylphosphine, TPP), an acid anhydride curing agent (4-methyltetrahydrophthalic anhydride, 4-MTHPA, equivalent 83), an amine curing agent (4,4'-diaminodiphenylmethane, DDM, equivalent 50), an inorganic filler (spherical silica having a maximum particle size of less than 24 μm and a mean particle size of 4 μm) a silane coupling agent (γ-glycidoxypropyltrimethoxysilane KBM403, Shin-Etsu Chemical Co., Ltd.), and a copolymer of the structural formula (23) below (aromatic polymer-organopolysiloxane copolymer having an epoxy equivalent of 291 and a polysiloxane content of 31.2% by weight) were blended as shown in Table 3 and uniformly dispersed in acetone.

A laminate film was fabricated by applying the mixed solution onto a PET film which had been surface treated with a silicone parting agent, drying the coating at 50° C. for 5 minutes, then at 80° C. for 5 minutes for removing the acetone and effecting B-staging reaction, obtaining a laminate film of 0.1 mm thick.

An article was fabricated by casting the mixed solution into a mold, drying the cast article at 50° C for 5 minutes, then at 80° C. for 5 minutes for removing the acetone, and post-curing at 150° C. for one hour.

Epoxy resin A (n(average) =0.063)

(13)

Epoxy resin B (n(average) =0.052)

(14)

Epoxy resin C

(15)

Epoxy resin D

(16)

Epoxy resins E, F

E: n = 0   F: n = 1.0 (average)

Phenolic resin A

Phenolic resin B

Phenolic resin C

Phenolic resin D

Phenolic resins E, F

E: n = 0   F: n = 1.0 (average)

Copolymer

TABLE 1

Structure and equivalent of epoxy resin

| | Structure | Epoxy equivalent | Tri- and poly-functionality |
|---|---|---|---|
| A | Bisphenol A | 179 | nil |
| B | Bisphenol F | 163 | nil |
| C | Biphenyl | 177 | nil |
| D | Phenol novolac | 156 | nil |
| E | Cresol novolac | 170 | nil |
| F | Cresol novolac | 172 | included |

TABLE 2

Structure and equivalent of phenolic resin

|   | Structure | Phenolic equivalent | Tri- and poly-functionality |
|---|---|---|---|
| A | Bisphenol A | 114 | nil |
| B | Bisphenol F | 100 | nil |
| C | Biphenyl | 121 | nil |
| D | Phenol novolac | 100 | nil |
| E | Cresol novolac | 114 | nil |
| F | Cresol novolac | 116 | included |

These epoxy resin compositions were examined by the following tests (a) to (d). The results are shown in Table 3.

(a) Film Handling

A composition was formed and semi-cured into film strips of 10 mm×50 mm×0.1 mm. Each strip was folded such that the short sides (10 mm) coincided with each other. The number of broken strips was reported per the total number of tested strips.

This test was carried out both immediately after film formation (0 hr) and after aging at 30° C. for 168 hours (168 hr). Five samples were tested for each of ten lots, and an average and a standard deviation (S.D.) were determined. The standard deviation represents the variation of semi-cured products, and the difference between the initial samples and the aged samples represents storage stability.

(b) Tg of Cured Composition

A composition was molded into a specimen of 5 mm×5 mm×15 mm. Tg was measured by means of TMA by heating the specimen at a rate of 5° C./min.

(c) Moisture Resistance

Figure 1:
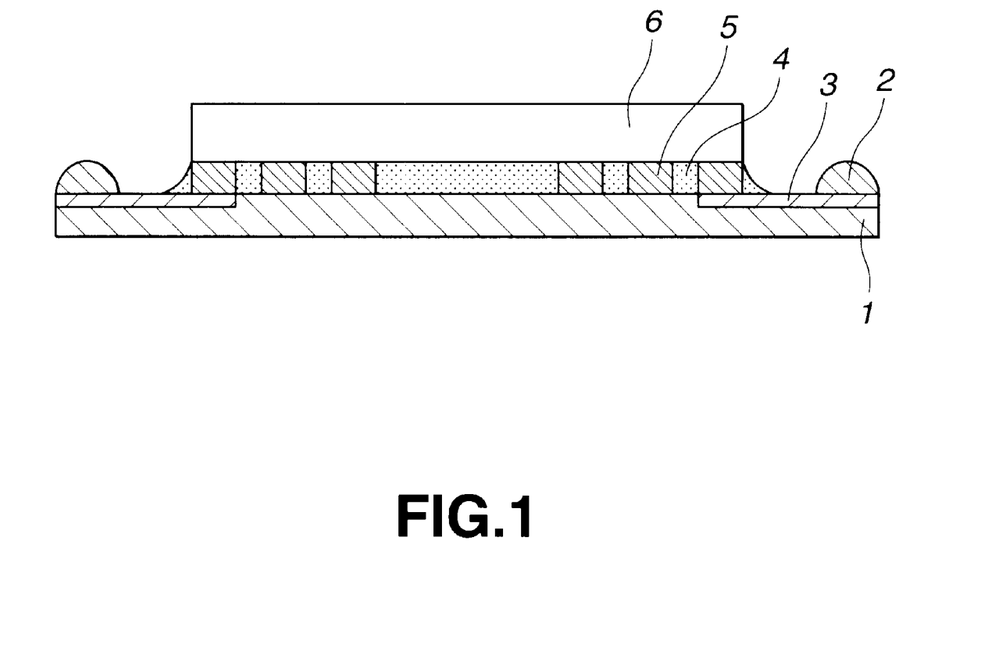
FIG. 1 illustrates in cross section a semiconductor package used in Examples and Comparative Examples.

A semiconductor package as shown in FIG. 1 was allowed to stand for 200 and 1,000 hours in an atmosphere of 121° C., RH 100% and 2 atm. Some package samples showed abnormal values because of line disconnection. The number of failed samples per the total number of tested samples is reported.

(d) Water Absorption

A composition was molded into a disk having a diameter of 50 mm and a thickness of 3 mm. The disk was allowed to stand for 24 hours in an atmosphere of 121° C., RH 100% and 2 atm. A weight change was determined.

Referring to FIG. 1, there is illustrated a semiconductor device package comprising a BT substrate 1, gold terminals 2, copper leads 3, an epoxy resin composition film 4, solder bumps 5, and a silicon chip 6. The epoxy resin composition film of 10 mm×10 mm×0.1 mm was placed on the BT substrate, moderately pressed thereto at 80° C. and 0.1 kgf/cm² for 5 seconds, and preheated at 120° C. for 10 seconds. The silicon chip of 10 mm×10 mm×0.3 mm having aluminum wiring and solder bumps formed thereon was positioned on the film. The film was heat molded at 180° C. and 10 kgf/cm² for 10 seconds and postcured at 150° C. for one hour, completing the semiconductor package.

TABLE 3

| Components (pbw) | E1 | E2 | E3 | E4 | E5 | CE1 | CE2 | CE3 | CE4 |
|---|---|---|---|---|---|---|---|---|---|
| Epoxy resin A | 56.7 | 0 | 0 | 0 | 0 | 62.7 | 66.7 | 0 | 0 |
| Epoxy resin B | 0 | 57.2 | 0 | 0 | 0 | 0 | 0 | 0 | 0 |
| Epoxy resin C | 0 | 0 | 57.4 | 0 | 0 | 0 | 0 | 0 | 0 |
| Epoxy resin D | 0 | 0 | 0 | 57.8 | 0 | 0 | 0 | 0 | 0 |
| Epoxy resin E | 0 | 0 | 0 | 0 | 57.2 | 0 | 0 | 0 | 57.2 |
| Epoxy resin F | 0 | 0 | 0 | 0 | 0 | 0 | 0 | 58.9 | 0 |
| Phenolic resin A | 17.7 | 0 | 0 | 0 | 0 | 0 | 0 | 0 | 0 |
| Phenolic resin B | 0 | 16.9 | 0 | 0 | 0 | 0 | 0 | 0 | 0 |
| Phenolic resin C | 0 | 0 | 17.0 | 0 | 0 | 0 | 0 | 0 | 0 |
| Phenolic resin D | 0 | 0 | 0 | 16.6 | 0 | 0 | 0 | 0 | 0 |
| Phenolic resin E | 0 | 0 | 0 | 0 | 17.2 | 0 | 0 | 15.5 | 0 |
| Phenolic resin F | 0 | 0 | 0 | 0 | 0 | 0 | 0 | 0 | 17.2 |
| 2PHZ | 2.5 | 2.5 | 2.5 | 2.5 | 2.5 | 2.5 | 2.5 | 2.5 | 2.5 |
| TPP | 1.0 | 1.0 | 1.0 | 1.0 | 1.0 | 0 | 0 | 0 | 0 |
| 4-MTHPA | 0 | 0 | 0 | 0 | 0 | 12.1 | 0 | 12.1 | 0 |
| DDM | 0 | 0 | 0 | 0 | 0 | 0 | 7.7 | 0 | 7.7 |
| Copolymer | 25.6 | 25.6 | 25.6 | 25.6 | 25.6 | 25.6 | 25.6 | 25.6 | 25.6 |
| Spherical silica | 300 | 300 | 300 | 300 | 300 | 300 | 300 | 300 | 300 |
| KBM403 | 1.0 | 1.0 | 1.0 | 1.0 | 1.0 | 1.0 | 1.0 | 1.0 | 1.0 |
| (a) Film handling | | | | | | | | | |
| 0 hr, average | 0/5 | 0/5 | 0/5 | 0/5 | 0/5 | 0.6/5 | 0.8/5 | 5/5 | 5/5 |
| 0 hr, S.D. | 0 | 0 | 0 | 0 | 0 | 0.14 | 0.16 | 0 | 0 |
| 168 hr, average | 0/5 | 0/5 | 0/5 | 0/5 | 0/5 | 3.1/5 | 4.0/5 | 5/5 | 5/5 |
| 168 hr, S.D. | 0 | 0 | 0 | 0 | 0 | 0.20 | 0.21 | 0 | 0 |
| (b) Tg of cured composition, ° C. | 138 | 136 | 142 | 132 | 135 | 148 | 124 | — | — |
| (c) Moisture resistance @200 hr. | 0/20 | 0/20 | 0/20 | 0/20 | 0/20 | 9/20 | 12/20 | — | — |
| (c) Moisture resistance @1000 hr. | 0/20 | 0/20 | 0/20 | 0/20 | 0/20 | 20/20 | 02/20 | — | — |
| (d) Water absorption, wt % | 0.65 | 0.66 | 0.63 | 0.66 | 0.64 | 0.91 | 1.10 | — | — |

Japanese Patent Application No. 11-108010 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. An epoxy resin composition comprising:

(A) a difunctional bisphenol type epoxy resin or a difunctional biphenyl type epoxy resin, (B) a first curing agent comprising a difunctional phenolic resin for polymerizing the epoxy resin (A) into a linear polymer,
wherein the difunctional epoxy resin and the difunctional phenolic resin are blended in such amounts that the equivalent ratio of epoxy groups to phenolic hydroxyl groups ranges from more than 1/1 to 10/1, (C) a second curing agent comprising an imidazole compound for crosslinking the linear polymer of components (A) and (B) into a three-dimensional polymer,
wherein the imidazole compound is employed at a weight ratio of from 0.001 through 0.2 with respect to the weight of the polymer of components (A) and (B), and (D) an organophosphorus compound serving as a curing accelerator for components (A) and (B),
wherein the organophosphorus compound is employed at a weight ratio of from 0.0001 through 0.1 with respect to the weight of the polymer of components (A) and (B).

2. An epoxy resin composition comprising a component (C) and a linear polymer obtained by reacting a component (A) with a component (B) in the presence of a component (D), wherein component (A) is a difunctional bisphenol type epoxy resin or a difunctional biphenyl type epoxy resin, component (B) is a first curing agent comprising a difunctional phenolic resin for polymerizing the epoxy resin (A) into a linear polymer, component (D) is an organophosphorus compound serving as a curing accelerator for components (A) and (B), and component (C) is a second curing agent comprising an imidazole compound for crosslinking the linear polymer of components (A) and (B) into a three-dimensional polymer,
and wherein the difunctional epoxy resin (A) and the difunctional phenolic resin (B) are blended in such amounts that the equivalent ratio of epoxy groups to phenolic hydroxyl groups ranges from more than 1/1 to 10/1, the imidazole compound (C) is employed at a weight ratio of from 0.001 through 0.2 with respect to the weight of the polymer of components (A) and (B), and the organophosphorus compound (D) is employed at a weight ratio of from 0.0001 through 0.1 with respect to the weight of the polymer of components (A) and (B).

3. A laminate film comprising at least two layers, at least one of which is formed of the epoxy resin composition of claim 2 to a thickness of 20 to 150 μm.

4. The epoxy resin composition of claim 1, wherein the imidazole compound is selected from the group consisting of 2-methylimidazole, 2-ethylimidazole, 2-ethyl-4-methylimidazole, 2-phenylimidazole, 2-phenyl-4-methylimidazole, 2-phenyl-4-methyl-5-hydroxymethylimidazole, 2-phenyl-4,5-dihydroxymethylimidazole, and mixtures thereof.

5. The epoxy resin composition of claim 1, wherein the organophosphorus compound is selected from the group consisting of triphenylphosphine, tributylphosphine, tri(p-toluyl)phosphine, tri(p-methoxyphenyl)phosphine, tri(p-ethoxyphenyl)phosphine, triphenylphosphine triphenyl borate, tetraphenyl phosphonium tetraphenyl borate, and mixtures thereof.

6. A semiconductor device comprising a semiconductor chip having a surface defining a gap with a substrate, the surface or gap being sealed with the laminate film of claim 3 in a cured state.

7. The epoxy resin composition of claim 1 further comprising an inorganic filler.

8. The epoxy resin composition of claim 1 further comprising a copolymer obtained by reacting an aromatic polymer selected from the group consisting of epoxy resins and phenolic resins with an organopolysiloxane of the following compositional formula (1):

$$R_a R'_b SiO_{(4-a-b)/2} \qquad (1)$$

wherein R represents hydrogen, an amino, epoxy, hydroxyl or carboxyl group-bearing monovalent hydrocarbon group, or an alkoxy group, R' represents a substituted or unsubstituted monovalent hydrocarbon group, "a" is a positive number of 0.001 to 1, "b" is a positive number of 1 to 2, and the sum of "a" and "b" is from 1 to 3, the number of silicon atoms in one molecule is 2 to 1,000, and the number of functional groups R directly attached to silicon atoms in one molecule is at least 1.

* * * * *